(12) United States Patent
Lee et al.

(10) Patent No.: US 6,965,171 B1
(45) Date of Patent: Nov. 15, 2005

(54) METHOD AND STRUCTURE FOR SELECTIVE THERMAL PASTE DEPOSITION AND RETENTION ON INTEGRATED CIRCUIT CHIP MODULES

(75) Inventors: Tim H. Lee, New Paltz, NY (US); Chon C. Lei, Poughkeepsie, NY (US); Donald J. Papae, Hopewell Junction, NY (US); Francis F. Szenher, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,931

(22) Filed: Jun. 7, 2004

(51) Int. Cl.[7] .......................... G01L 23/48; G01L 23/52; G01L 29/40
(52) U.S. Cl. .................... 257/783; 257/782; 438/118
(58) Field of Search ................................ 257/706, 707, 257/782, 783, 704, 710, 711, 119; 438/118, 438/122, 125

(56) References Cited

U.S. PATENT DOCUMENTS

| | | | |
|---|---|---|---|
| 5,409,863 A * | 4/1995 | Newman ..................... 29/827 |
| 5,706,171 A | 1/1998 | Edwards et al. |
| 5,770,478 A | 6/1998 | Iruvanti et al. |
| 5,825,087 A | 10/1998 | Iruvanti et al. |
| 5,891,755 A | 4/1999 | Edwards et al. |
| 5,990,418 A * | 11/1999 | Bivona et al. ............. 174/52.4 |
| 6,376,907 B1 * | 4/2002 | Takano et al. .............. 257/704 |
| 6,426,565 B1 * | 7/2002 | Bhatt et al. ................. 257/783 |
| 6,535,388 B1 * | 3/2003 | Garcia ........................ 361/704 |

* cited by examiner

Primary Examiner—S. V. Clark
(74) Attorney, Agent, or Firm—James J. Cioffi; Cantor Colburn LLP

(57) ABSTRACT

An integrated circuit (IC) chip module includes at least one integrated circuit chip mounted upon a substrate, and a plurality of passive components mounted upon the substrate. A polymer based bib has at least one opening formed therein, the at least one opening configured to accommodate the at least one integrated circuit chip therein, and the bib further configured for attachment to one or more of the plurality of passive components. A protective cap is mounted over the at least one integrated circuit chip and attached to the substrate, wherein the bib is configured to retain thereon a thermally conductive paste initially applied to at least one of the integrated circuit chip and the protective cap.

14 Claims, 4 Drawing Sheets

METHOD AND STRUCTURE FOR SELECTIVE THERMAL PASTE DEPOSITION AND RETENTION ON INTEGRATED CIRCUIT CHIP MODULES

BACKGROUND OF INVENTION

The present invention relates generally to semiconductor device packaging, and, more particularly, to a method and structure for selective thermal paste deposition and retention on integrated circuit chip modules.

The removal of heat from electronic components is a problem continuously faced by electronic packaging engineers. As electronic components have become smaller and more densely packed on integrated boards and chips, designers and manufacturers now are faced with the challenge of how to dissipate the heat generated by these components. It is well known than many electronic components, especially semiconductor components such as transistors and microprocessors, are more prone to failure or malfunction at high temperatures. Thus, the ability to dissipate heat often is a limiting factor on the performance of the component.

Electronic components within integrated circuits have been traditionally cooled via forced or natural convective circulation of air within the housing of the device. In this regard, cooling fins have been provided as an integral part of the component package or as separately attached elements thereto for increasing the surface area of the package exposed to convectively developed air currents. Electric fans have also been employed to increase the volumetric flow rate of air circulated within the housing. For high power circuits (as well as smaller, more densely packed circuits of presently existing designs), however, simple air circulation often has been found to be insufficient to adequately cool the circuit components.

It is also well known that heat dissipation, beyond that which is attainable by simple air circulation, may be effected by the direct mounting of the electronic component to a thermal dissipation member such as a "cold-plate" or other heat sink. The heat sink may be a dedicated, thermally conductive metal plate, or simply the chassis of the device. However, the thermal interface surfaces of an electronic component and associated heat sink are typically irregular, either on a gross or a microscopic scale. When these interfaces surfaces are mated, pockets or void spaces are developed there in-between in which air may become entrapped. These pockets reduce the overall surface area contact within the interface, which, in turn, reduces the efficiency of the heat transfer therethrough. Moreover, as is also well known, air is a relatively poor thermal conductor. Thus, the presence of air pockets within the interface reduces the rate of thermal transfer through the interface.

To improve the efficiency of the heat transfer through the interface, a layer of a thermally conductive material typically is interposed between a heat sink device and electronic component to fill in any surface irregularities and eliminate/reduce air pockets. For example, IBM's ATC 3.8 (advanced thermal compound) is a thermal paste applied to the surface of a chip or protective metal cap of a single chip module (SCM) or multichip module (MCM). The amount of paste volume applied is typically 2 to 3 times the volume of the gap between the chip surface and the pedestal of the protective metal cap. Once the metal cap is pressed onto the top surface of the module during a cap attachment operation, the thermal paste fills the gaps between the chip surface and pedestal of the metal cap for effective thermal management.

However, as a result of the cap attachment process, some volume of the excess thermal paste is typically squeezed out from the chip surface and deposited onto the module surfaces adjacent to the chip. For those module configurations where there are separately mounted passive components (e.g., capacitors and resistors) in close proximity to the chip (and the chip is not underfilled), the excess paste squeezed out from the attachment process may be deposited on the passive components and underneath the chip. Unfortunately, the presence of thermal paste upon certain passive components can degrade the frequency response of analog as well as digital chip modules. In particular, passive components (such as resistors located on the module top surface or signal lines buried in the module substrate) can carry signals in the gigahertz range. If covered by a thermal paste, absorption of the high-frequency signal can take place. This in turn can have a negative effect on the module performance and cause the module not to meet designed electrical specifications.

Accordingly, it would be desirable to be able to implement the application of a thermal paste for integrated circuit chip module in a manner that prevents the paste from spreading to unwanted areas such as on passive components, substrate wiring traces, and beneath the chip(s).

SUMMARY OF INVENTION

The foregoing discussed drawbacks and deficiencies of the prior art are overcome or alleviated by a structure for retaining a thermally conductive paste used in an integrated circuit module. In an exemplary embodiment, the structure includes a polymer based bib having an opening formed therein, the opening being configured to accommodate an integrated circuit chip therein. The bib further is configured for attachment to a plurality of support structures proximate the integrated circuit chip.

In another embodiment, an integrated circuit (IC) chip module includes at least one integrated circuit chip mounted upon a substrate, and a plurality of passive components mounted upon the substrate. A polymer based bib has at least one opening formed therein, the at least one opening configured to accommodate the at least one integrated circuit chip therein, and the bib further configured for attachment to one or more of the plurality of passive components. A protective cap is mounted over the at least one integrated circuit chip and attached to the substrate, wherein the bib is configured to retain thereon a thermally conductive paste initially applied to at least one of the integrated circuit chip and the protective cap.

In still another embodiment, a method for selective thermal paste deposition and retention on an integrated circuit chip module includes positioning a polymer based bib around an integrated circuit chip mounted to a substrate. The bib has at least one opening formed therein to accommodate the integrated circuit chip therein, and is attached to one or more of a plurality of passive components mounted on the substrate. A thermally conductive paste is applied to at least one of the integrated circuit chip and a protective cap. The protective cap is mounted over the integrated circuit chip and attached to the substrate, wherein the bib is configured to retain thereon excess portions of the thermally conductive paste displaced by the mounting of the protective cap over the integrated circuit chip.

BRIEF DESCRIPTION OF DRAWINGS

Referring to the exemplary drawings wherein like elements are numbered alike in the several Figures.

DETAILED DESCRIPTION

Figure 1:
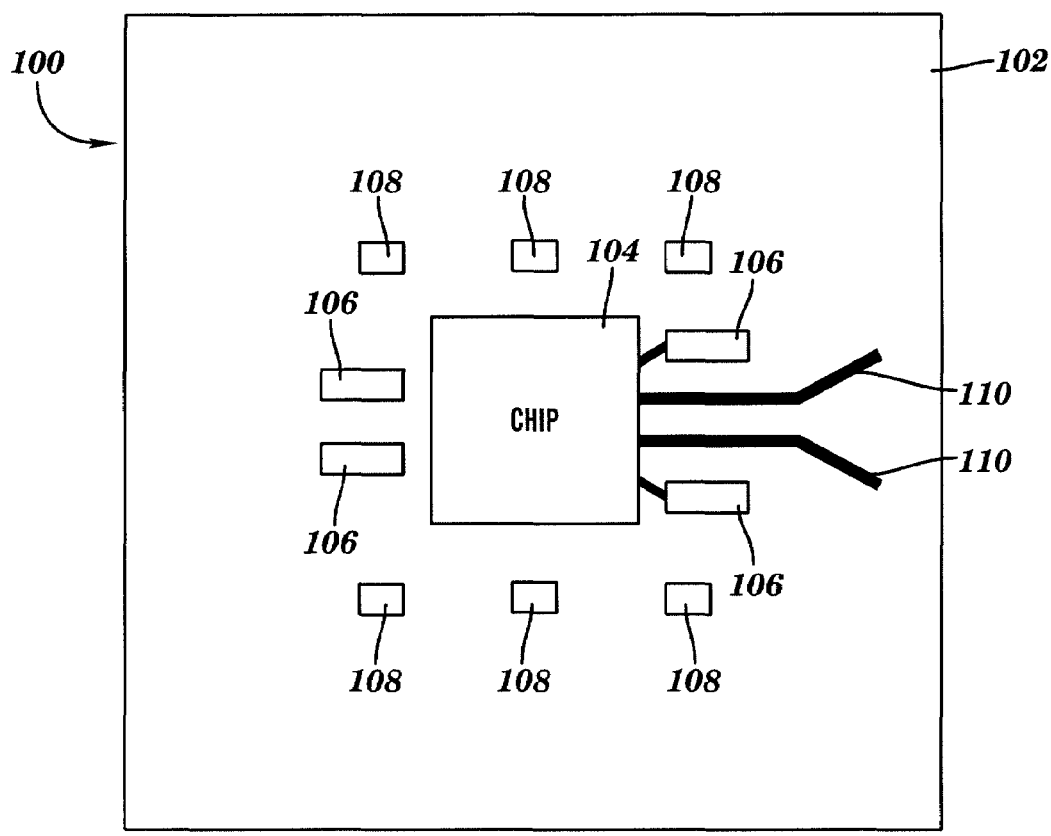
FIG. 1 is a plan view of an exemplary integrated circuit chip module, suitable for use in accordance with an embodiment of the invention.
Figure 2:
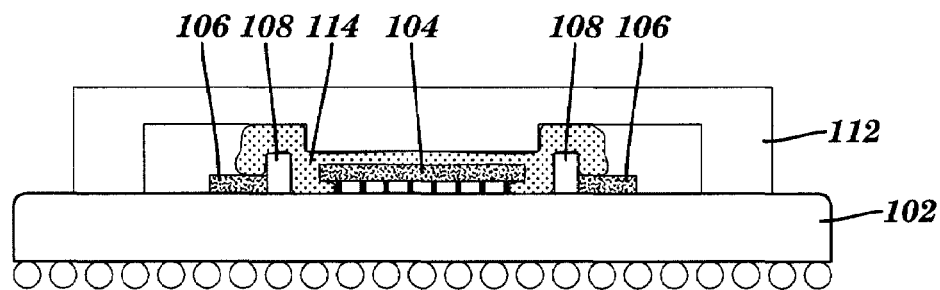
FIG. 2 is a cross-sectional view of the integrated circuit chip module, illustrating a conventional application of a protective cap with a thermally conductive paste interface.

Referring initially to FIG. 1, there is shown a plan view of an exemplary integrated circuit chip module 100, suitable for use in accordance with an embodiment of the invention. The module 100 includes a substrate 102 having one or more integrated circuit (IC) chips 104 mounted thereon. In addition, a plurality of discrete, stand-alone electronic components are included on the substrate including, for example, surface mounted resistors 106, decoupling capacitors 108, and conductive microstrip traces 110. As shown in the cross-sectional view of FIG. 2, a metallic cap 112 or lid is attached to the surface of the substrate 102 for mechanically protecting the chip 104, and to provide a heat transfer path from the back of the chip 104 to the external cooling environment. In order to enhance heat transfer, a highly thermally conductive paste 114 containing ceramic, metal and/or metal oxide particles or the like (e.g., ATC 3.8) is applied between the back of the chip 104 and the cap 112. In a conventional application of the thermal paste, the compression of the cap 112 causes excess paste material to be squeezed beyond the boundaries of the chip surface and onto the passive components, such as resistors 106 and decoupling capacitors 108.

As indicated previously, the thermal paste 114 used to provide a low thermal resistive path between the chip 104 and the package lid 112 contains metal oxides. Thus, the smearing of the thermal paste 114 from the chip 104 onto the top surface of the substrate 102 changes the electrical characteristics of the chip 104, as well as the surface mounted passive components and the microstrip transmission line traces on or below the top surface the substrate 102. In a linear wideband amplifier circuit (e.g., DC to about 7 GHz or more) this change in electrical characteristics causes changes in gain over the desired frequency band, thereby severely limiting the bandwidth of the device and the gain flatness over the frequency band.

Moreover, for certain mixed signal and analog devices, it is detrimental to the overall operation of the module to have the chip (die) underfilled with an epoxy during the module fabrication process. More specifically, the inherent dielectric constant of underfill material reduces the effective bandwidth of the device and can adversely affect input and output impedance matching. Accordingly, unwanted underfill material (such as excess thermal paste and/or epoxy) may change the impedance of chip top level metal interconnects, as well as change the distributed capacitance of top level inductor structures used as filters or for input/output impedance matching. In other words, for certain integrated circuit applications, it is desirable to maintain an air gap between the chip and the substrate.

Therefore, in accordance with an embodiment of the invention, there is disclosed a structure and method for retaining thermal paste upon application of a protective lid to an integrated circuit module. In this regard, a polymer based protective "bib" is applied around the perimeter of the IC chip (or chips) on the module and mounted over a plurality of individual surface-mounted components such as the decoupling capacitors. In this manner, the bib supports the excess thermal paste displaced by the contact between the protective lid and the IC chip, thus keeping the paste from forming over the surface mounted components and beneath the chip to maintain desired device performance.

Figure 3:
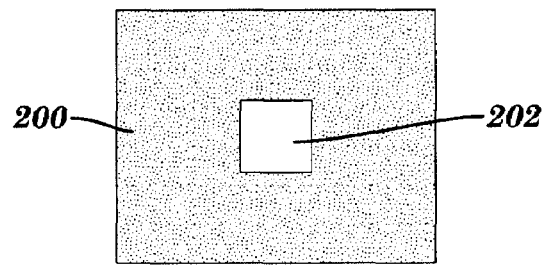
FIG. 3 is a plan view of a protective bib having an opening defined therein, in accordance with an embodiment of the invention.

FIG. 3 is a plan view illustrating a protective bib 200 having an opening 202 defined therein to accommodate the dimensions of the IC chip. The opening 202 in the bib 200 is generally sized in accordance with x-y dimensions of the chip, accounting for an additional tolerance (e.g., 0.001 inch) in each direction. Again, since the exemplary embodiment illustrates a single chip module, it will be appreciated that for multichip modules, the bib 200 would be patterned with an appropriate number of openings to accommodate each chip on the module. In an exemplary embodiment, the bib 200 is formed from a thin piece of plastic film having an operating temperature up to about 260° C., that is inert with respect to a synthetic oil, and that has an adhesive coating on a back side thereof. Accordingly, one suitable material for the bib 200 is Kapton®, a polyimide insulating film available from DuPont. Other types of material, however, are also contemplated.

Figure 4:
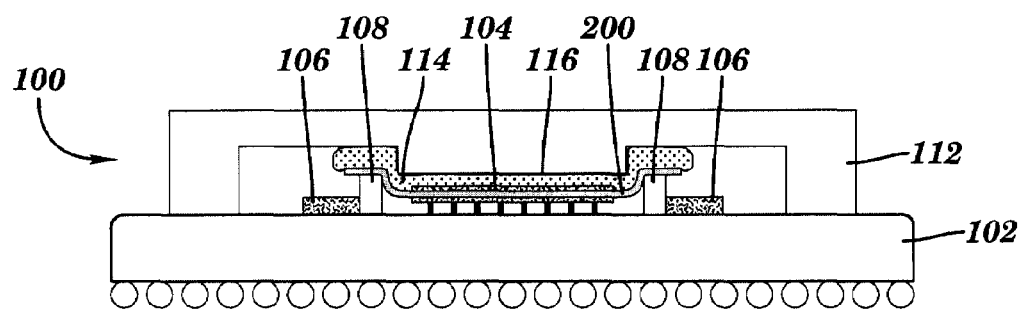
FIG. 4 is a cross-sectional view of the exemplary IC chip module, utilizing the protective bib of FIG. 3.

FIG. 4 is a cross-sectional view of the IC chip module 100, utilizing the protective bib 200 of FIG. 3. Prior to the application of the protective bib 200, the chip 104 and other passive components mounted on the surface of the substrate 102 are subjected to normal joining and reflow processes. Then, the bib is manually applied around the chip 104 by pressing the bottom adhesive of the bib 200 against the top surface of surrounding surface mounted components, such as the decoupling capacitors 108. In an exemplary embodiment, there is at least one surface mounted structure proximate each corner of the chip 104 on which the bib 200 may be affixed. In the embodiment illustrated in FIG. 4, the height of the surrounding decoupling capacitors 108 exceeds the height of the chip 104. Accordingly, some slack is left in the bib 200 so that it surrounds the chip at about the midpoint of its thickness.

Once the bib 200 is mounted, the thermal paste is then applied onto the top of the chip 104 and/or the inside surface 116 of the cap 112. The cap 112 is then applied to the chip and substrate surfaces in a conventional manner. As further shown in FIG. 4, the bib 200 prevents the excess thermal paste 114 from being displaced and reformed directly atop the surface mounted components, as well as underneath the chip itself.

Figure 5:
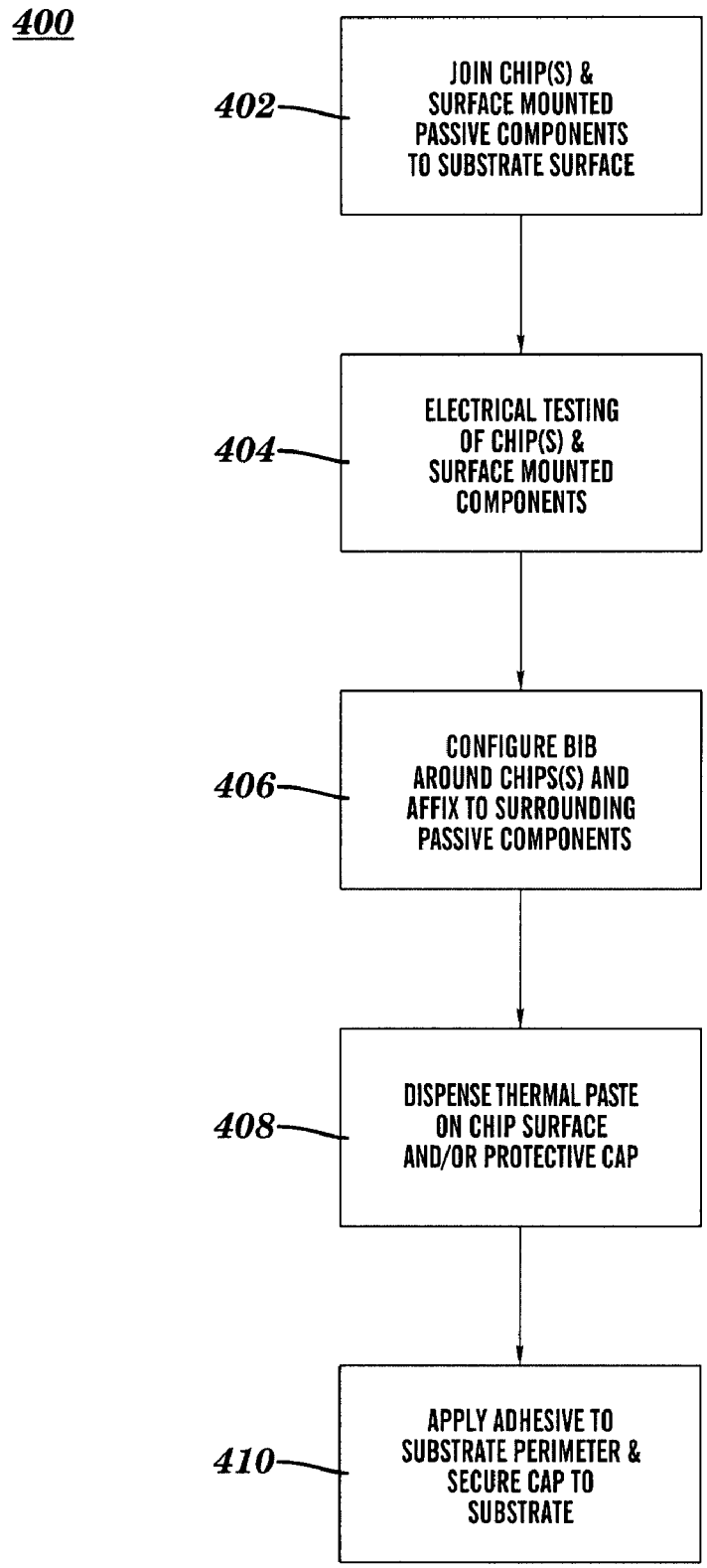
FIG. 5 is a process flow diagram illustrating a method for selective thermal paste deposition and retention on integrated circuit chip module, in accordance with a further embodiment of the invention.

FIG. 5 is a process flow diagram illustrating a method 400 for selective thermal paste deposition and retention on integrated circuit chip module, in accordance with a further embodiment of the invention. In block 402, one or more integrated circuit chips and passive components are joined with the surface of a substrate. While the passive components (e.g., resistors, capacitors, etc.) may be arranged on the substrate on any number of configurations, it will be noted that there should be sufficient structures surrounding the chip(s) for subsequent mounting and placement of the bib. Once the devices are formed on the substrate, electrical testing of the chip(s) and passive components may take place, as shown in block 404.

Assuming satisfactory performance of the chip(s) and passive components, the bib is then positioned around the perimeter of the chip(s) and adhered to the passive components (e.g., decoupling capacitors), as shown in block 406. As such, the passive components to which the bib is mounted serve a dual purpose (i.e., a support structure as well for electrical performance of the module). Then, at block 408, a suitable thermally conductive paste (e.g., ATC 3.8) is applied to the top of the chip(s) and/or the protective cap. Finally, as indicated at block 410, the protective cap is secured to the substrate through the application of an adhesive material such as, for example, Sylgard® (a silicone elastomer adhesive available from Dow Corning) to the perimeter of the substrate. A mechanical retaining assembly, such a spring clip may be applied to the cap/module during the adhesive curing process. Once cured, the electrical components of the IC module may be retested to verify the application of the thermally conductive paste has not degraded the device performance.

Figure 6:
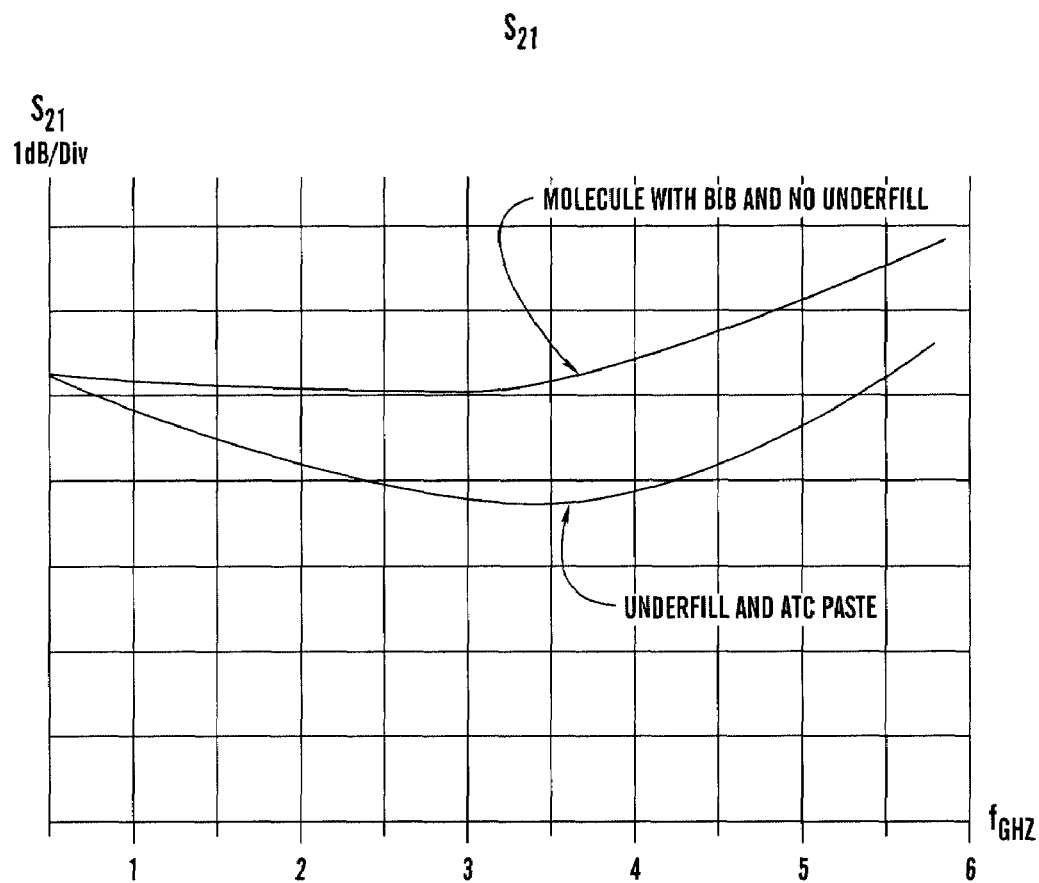
FIG. 6 is a graph illustrating a comparison of frequency response curves between an exemplary IC chip module utilizing the protective bib of FIG. 3 with no underfill material, and a module utilizing both thermal paste and underfill material.

Through the application of the above described protective bib, no changes in "rise time" frequency have been observed during electrical testing subsequent to the application of the thermal paste and cap attachment, as illustrated by the frequency response curves in FIG. 6. Moreover, the removal of the protective cap from module substrate reveals the absence of thermal paste from the surface of the separately mounted resistors and underneath the integrated circuit chips.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A structure for retaining a thermally conductive paste used in an integrated circuit module, comprising:
    a polymer based bib having an opening formed therein, said opening being configured to accommodate an integrated circuit chip therein; and
    said bib further configured for attachment to a plurality of support structures proximate the integrated circuit chip;
    wherein said bib further comprises an adhesive surface on one side thereof, and an opposite side thereof is configured for retaining the thermally conductive paste initially applied to the integrated circuit chip.

2. The structure of claim 1, wherein said bib has an operating temperature up to at least about 260° C.

3. The structure of claim 1, wherein said bib is inert with respect to a synthetic oil.

4. The structure of claim 1, wherein said bib further comprises a polyimide film.

5. An integrated circuit (IC) chip module, comprising:
    at least one integrated circuit chip mounted upon a substrate;
    a plurality of passive components mounted upon said substrate;
    a polymer based bib having at least one opening formed therein, said at least one opening configured to accommodate said at least one integrated circuit chip therein, and said bib further configured for attachment to one or more of said plurality of passive components; and
    a protective cap mounted over said at least one integrated circuit chip and attached to said substrate;
    wherein said bib is configured to retain thereon a thermally conductive paste initially applied to at least one of said integrated circuit chip and said protective cap; and
    wherein said bib further comprises an adhesive surface on one side thereof, and an opposite side thereof is configured for retaining said thermally conductive paste.

6. The IC chip module of claim 5, wherein said bib has an operating temperature up to at least about 260° C.

7. The IC chip module of claim 5, wherein said bib is inert with respect to a synthetic oil.

8. The IC chip module of claim 5, wherein said bib further comprises a polyimide film.

9. The IC chip module of claim 5, wherein said bib is attached to decoupling capacitors located proximate corners of said at least one integrated circuit chip.

10. A method for selective thermal paste deposition and retention on an integrated circuit chip module, the method comprising:
    positioning a polymer based bib around an integrated circuit chip mounted to a substrate, said bib having at least one opening formed therein to accommodate said integrated circuit chip therein;
    attaching said bib to one or more of a plurality of passive components mounted on said substrate; and
    applying a thermally conductive paste to at least one of said integrated circuit chip and a protective cap; and
    mounting said protective cap over said integrated circuit chip and attaching said protective cap to said substrate;
    wherein said bib is configured to retain thereon excess portions of said thermally conductive paste displaced by said mounting said protective cap over said integrated circuit chip; and
    wherein said bib further comprises an adhesive surface on one side thereof, and an opposite side thereof is configured for retaining said thermally conductive paste.

11. The method of claim 10, wherein said bib has an operating temperature up to at least about 260° C.

12. The method of claim 10, wherein said bib is inert with respect to a synthetic oil.

13. The method of claim 10, wherein said bib further comprises a polyimide film.

14. The method of claim 10, wherein said bib is attached to decoupling capacitors located proximate corners of said at least one integrated circuit chip.

* * * * *